United States Patent [19]
Fassina et al.

[11] Patent Number: 5,629,647
[45] Date of Patent: May 13, 1997

[54] AUDIO AMPLIFIER SWITCHING NOISE MEASURING METHOD AND DEVICE

[75] Inventors: Andrea Fassina, Milan; Giovanni Avenia, Gorgonzola; Elia Pagani, Bergamo, all of Italy

[73] Assignee: SGS-Thomson Microelectronics S.r.l., Agrate Brianza, Italy

[21] Appl. No.: 493,367

[22] Filed: Jun. 21, 1995

[30] Foreign Application Priority Data

Jun. 22, 1994 [EP] European Pat. Off. ............ 94830302

[51] Int. Cl.$^6$ .................... H03F 21/00; G01R 29/26
[52] U.S. Cl. ................................... 330/2; 324/613
[58] Field of Search ................ 330/2; 324/613, 324/614

[56] References Cited

U.S. PATENT DOCUMENTS

| | | | |
|---|---|---|---|
| 3,535,635 | 10/1970 | Okumura | 324/613 X |
| 3,723,874 | 3/1973 | Hamon et al. | 324/614 X |
| 4,806,845 | 2/1989 | Nakano et al. | 324/613 |

FOREIGN PATENT DOCUMENTS 246683  10/1988  Japan ..................... 324/613

OTHER PUBLICATIONS

European Search Report from European Patent Application No. 94830302.9, filed Jun. 22, 1994.
Database WPI, Week 9015, Derwent Publications Ltd., London, GB; AN 90–110076 & JP–A–2 058 907 NEC Feb. 28, 1990.
Radio Fernsehen Elektronik, vol. 26, No. 6, 1977, pp. 182–186 Frommhold, "Neuer Messplatz".
Funkschau, vol. 50, No. 6, Mar. 1978, pp. 251–253, Heucke "Mikroprozessorgesteuerter Tunermessplatz".

*Primary Examiner*—James B. Mullins
*Attorney, Agent, or Firm*—David M. Driscoll; James H. Morris

[57] ABSTRACT

A method and device for measuring the switching noise of an audio amplifier by measuring the energy of the noise signal at the output of the audio amplifier as the amplifier is switched from one operating condition to another by a control signal, and after first weighing the energy according to the frequency and volume sensitivity of the human ear. The device comprises a control signal generator; an audio band filter connected to the output of the audio amplifier; a meter for measuring the power of the filtered signal; and an integrating element for calculating the energy of the filtered signal.

36 Claims, 3 Drawing Sheets

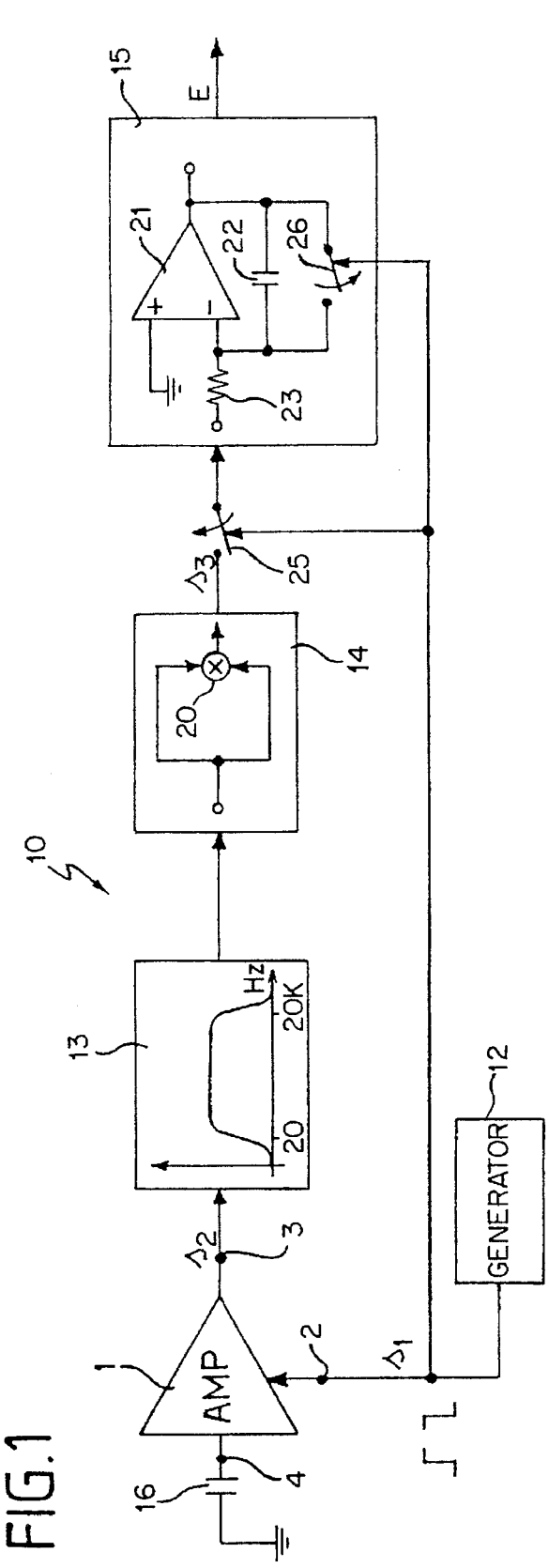
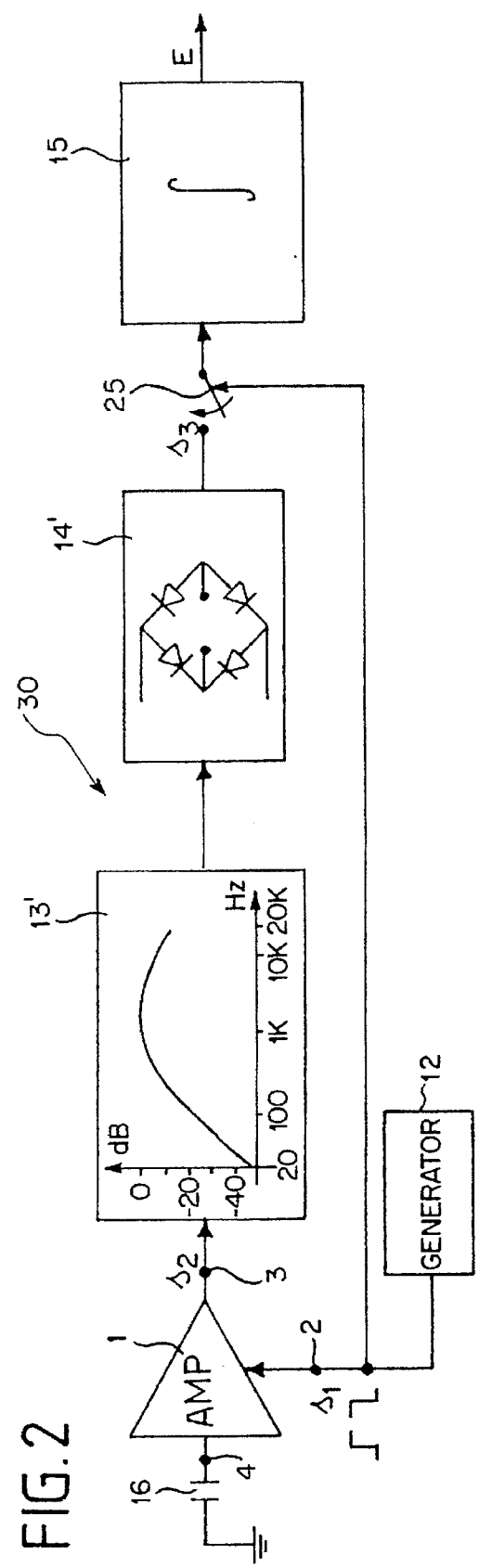

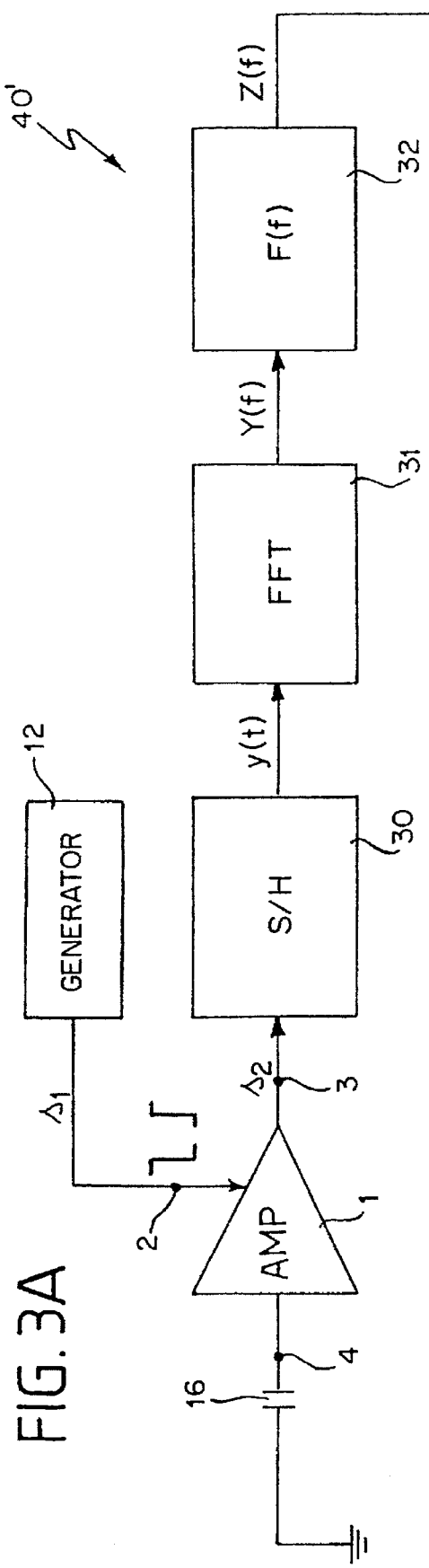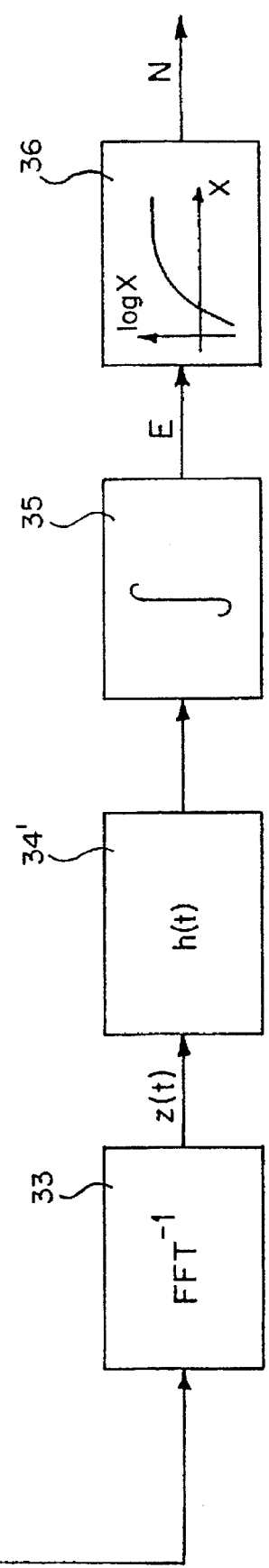
FIG. 3A

AUDIO AMPLIFIER SWITCHING NOISE MEASURING METHOD AND DEVICE

BACKGROUND OF THE INVENTION

1. Field of the Invention

The present invention relates to an audio amplifier switching noise measuring method and device.

2. Discussion of the Related Art

As is known, an important parameter for evaluating audio amplifiers is the noise—also known as "pop"—produced at the load terminals when the amplifier switches from one operating condition to another, e.g. when it is turned on or off, or switched from standby to normal operation and vice versa.

Quality testing the amplifier therefore requires a noise measuring method which:

a) is easy to implement;

b) can be used on automatic test equipment;

c) is fast;

d) is closely related to the sensitivity of the human ear.

Of these, requirements a–c are important for enabling 100% quality control, while d, which is the most important as regards the validity of the test, is also the most difficult to achieve by requiring an objective evaluation of a subjective phenomenon such as a person's hearing.

One method currently used for automatically measuring the switching noise of an amplifier consists in measuring the peak-to-peak value of the output voltage of the amplifier during switching, the measurement normally being made analogically using a peak meter and acquiring the peak to peak value at the end of the transient state. The results of the above known method are often fairly closely related to the sensitivity of the human ear when testing one type of amplifier in the same type of application, but the results are less than satisfactory and differ widely when testing different amplifiers or the same type of amplifier in different applications. This is due to the fact that two transitions with the same peak-to-peak value but a different time pattern cannot be distinguished, even though, to the ear, they may differ widely.

It is an object of the present invention to provide a switching noise measuring method and device capable of providing measurements closely related to the sensitivity of the human ear, and which may be implemented easily on modern test equipment, and applied to any type of amplifier (bridge or single-ended).

SUMMARY OF THE INVENTION

The invention provides a method of measuring the switching noise of an audio amplifier. The method includes steps of switching the audio amplifier between different operational states, detecting a noise signal caused by the switching, filtering the noise signal to obtain an audio band signal, and determining the value of energy in the audio band signal.

The present invention also provides a device for measuring the switching noise of an audio amplifier. The device includes an audio filter to filter an output noise signal from the audio amplifier to provide an audio band signal, and an integrator that determines a value of energy contained within the audio band signal.

In another embodiment, the invention provides an automatic test unit for measuring the switching noise of an audio amplifier. The automatic test unit includes a filter that receives a noise signal from the amplifier and provides a filtered signal corresponding to the result of an audio band filtering of the noise signal, and an integrator circuit coupled to the filter that provides a value of energy contained within the filtered signal.

BRIEF DESCRIPTION OF THE DRAWINGS

A number of preferred, non-limiting embodiments of the present invention will be described by way of example with reference to the accompanying drawings, in which:

FIG. 1 shows a first analog embodiment of a circuit implementing the measuring method and apparatus according to the present invention;

FIG. 2 shows a second analog embodiment implementing the method and apparatus according to the present invention;

FIGS. 3 and 3A show a third, digital, embodiment implementing the method and apparatus according to the present invention.

DETAILED DESCRIPTION

Figure 3:
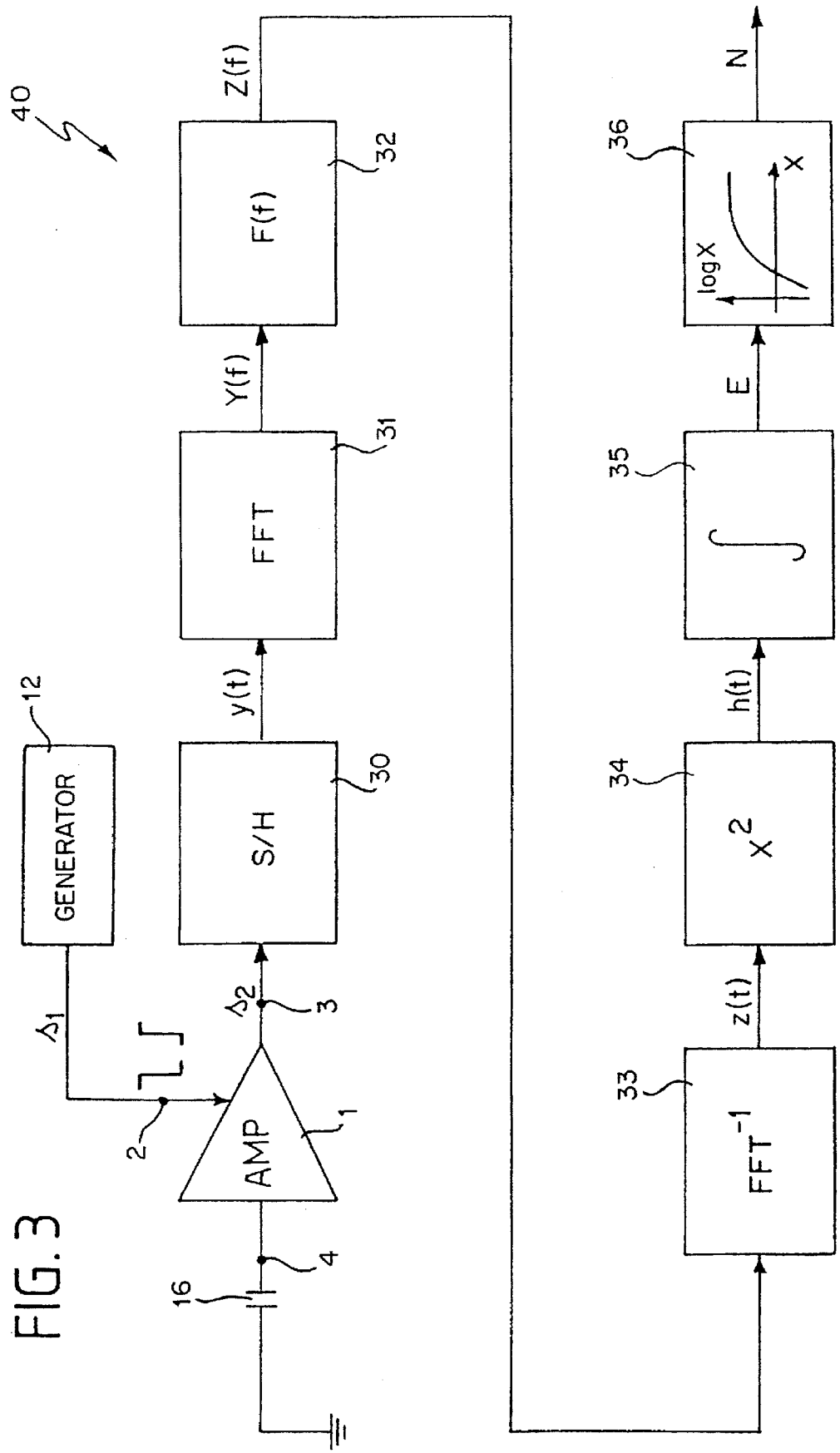

In FIG. 1, measuring device 10 is connected to a power audio amplifier 1 and comprises a switching enabling signal generator 12 connected to an input terminal 2 of amplifier 1; an audio band filter 13 connected to the output terminal 3 of amplifier 1; a squaring block 14 connected downstream from audio filter 13; a signal integrating block 15 connected downstream from squaring block 14; and a capacitor 16, a first terminal of which is grounded, and a second terminal of which is connected to an input terminal 4 of amplifier 1.

In the FIG. 1 embodiment, filter 13 is a typical flat filter with a 20 Hz to 20 KHz pass band; squaring block 14 comprises a multiplier (e.g. a Gilbert multiplier) 20, the two inputs of which are supplied with the same signal; and integrating block 15 comprises an integrating operational amplifier 21, with a capacitor 22 connected between the output and inverting input of operational amplifier 21, and a resistor 23 connected between the input of block 15 and the same inverting input. Between the output of block 14 and the input of block 15, there is provided a switch 25 controlled by the signal $s_1$ generated by generator 12 so that it opens prior to transition of the control signal switching test amplifier 1, and closes upon reception of the transition (start of the measurement); and, parallel with capacitor 22, there is provided a switch 26 controlled in counter-phase with respect to switch 25 so that it closes (to keep capacitor 22 discharged) prior to the start of the measurement, and opens at the start of the measurement (transition of the control signal).

The FIG. 1 embodiment operates as follows. The input of test amplifier 1 is grounded by d.c. decoupling capacitor 16 to perform the measurement in the absence of a signal; and, to perform the measurement, generator 12 generates a transition of control signal $s_1$, which may correspond to turn-on or turn-off of the bias current sources of test amplifier 1, or to switching of the MOS signal for switching from standby to normal operation and vice versa.

Upon signal $s_1$ switching, switch 25 closes and switch 26 opens; test amplifier 1 generates at the output (terminal 3) a noise signal $s_2$ to be measured, which is filtered by filter 13 to eliminate the frequencies outside the audio band, and is squared in block 14; and the output signal $s_3$ from block 14 is integrated for an appropriate time, depending on the duration of the transient state of signal s2 (calculated experimentally beforehand), to give a value E equal to the audio-band energy of noise signal $s_2$.

Device 30 in FIG. 2 comprises the same blocks as circuit 10 in FIG. 1, with the exception of filter block 13 and squaring block 14 which are implemented by different elements indicated 13' and 14'.

More specifically, filter 13' in FIG. 2 consists of a so-called "A" filter as per IEC standard Rec. 179, which presents a roughly 2 KHz peak approximating the frequency sensitivity of the human ear. Such a filter (the frequency attenuation of which is shown in FIG. 2) is commonly used in audio devices and therefore requires no further description.

Block 14' in FIG. 2 provides for determining the absolute value of the output signal from filter 13', as an approximation of the squaring operation performed in FIG. 1, for which purpose FIG. 2 shows a schematic full-wave diode rectifier.

The FIG. 2 embodiment operates similar to the embodiment shown in FIG. 1: filter 13' filters the noise signal $s_2$ generated by amplifier 1 upon reception of the switching edge of control signal $s_1$; and the filtered signal is rectified in block 14' and integrated in block 15 to give a signal indicating the energy of switching signal $s_2$.

The FIG. 3 block diagram shows an embodiment of the present invention including digital signal processing means, in which case, switching signal s2 may be processed numerically by software functions shown in block form in FIG. 3.

As shown in FIG. 3, test unit 40 (of which are shown only the blocks relative to the switching noise measuring functions according to the present invention) comprises a signal generator 12, as in the FIG. 1 and 2 circuits, which generates at the output a switching control signal $s_1$, the high-to-low or low-to-high transition of which simulates switching of the operating state of amplifier 1 as already described. In this case also, the output of generator 12 is connected to input 2 of amplifier 1, the signal input 4 of which is grounded by decoupling capacitor 16.

Unit 40 also has, in cascade to each other, a sampling block 30; a frequency-domain transformation block 31 (e.g. by means of a Fourier transform); a filter 32; a time-domain antitransformation block 33; a squaring block 34; an integrating block 35; and a weighing block 36.

Sampling block 30 generates in known manner a vector y(t); and the sampling frequency $f_C$ is selected on the basis of the sampling theorem (at least twice the maximum frequency of the sampled signal to enable it to be reconstructed). In this particular case, $f_C > 32$ KHz, and for extremely high precision $f_C > 40$ KHz.

Block 31 preferably performs a fast Fourier transform using the elements of vector y(t), and generates a complex vector Y(f), each of the elements of which is multiplied by the complex value, at the same frequency, of the transfer function F(f) of filter 32. Filter 32, preferably an "A" filter as in FIG. 2, may be known either in analytic form or in table form, as module and phase or as real and imaginary part. The output of filter 32 generates a complex vector Z(f) which is time-domain transformed by block 33.

Block 33 preferably performs an inverted fast Fourier transform FFT$^{-1}$ and generates at the output a real time-domain vector z(t). Transformation and antitransformation blocks 31, 33 may be implemented by algorithms normally already provided in the programming languages of test equipments designed for digital signal processing. Alternatively, use may be made of numerical analysis algorithms which perform the same operations and are readily available.

Squaring block 34 provides for amplitude weighing vector z(t), and generates at the output a vector h(t)=z$_2$(t) which is time integrated in block 35. Blocks 34 and 35, like blocks 31, 33, may be implemented by algorithms already provided on the test equipment, or by commonly used numerical analysis rules. Block 36 calculates the logarithm of the resulting energy value E (representing the energy of the audio band noise signal) to take into account the (nonlinear) power or energy sensitivity curve of the ear and so enhance the low and compress the high levels.

The resulting end value N is closely related to the sensitivity of the ear, and is an objective parameter that can be used for any type of amplifier, even on different test units providing the same algorithm is used, and may therefore be used for evaluating the quality of audio amplifier 1. The measuring method described therefore provides for achieving requirements a)–d) referred to in the introduction, by virtue of being easy to implement and usable analogically by means of a straightforward circuit connectable to test equipment or even digitally within the test equipment; and by virtue of being fast operating and, as stated, supplying a parameter that takes into account the sensitivity of the human ear.

The method according to the present invention can also be implemented on automatic test equipment 40, can be applied to any type of amplifier, and, in the case of the numeric technique embodiment described with reference to FIG. 3, provides for highly straightforward modification of the weight functions (implemented in blocks 32, 34 and 36).

Clearly, changes may be made to the method and device as described and illustrated herein without, however, departing from the scope of the present invention. In particular, filter elements 13, 13' and 32 may be formed in various ways providing they present an audio pass band; and energy computing blocks 14, 14' and 34 may be implemented by other energy approximating elements. For example, the squaring block may be replaced by other blocks implementing approximating functions, such as calculation of absolute value h(t)=|z(t)|, possibly with background noise filtration, according to the following equations:

$$h(t) = \begin{cases} z^2(t) & \text{if } z(t) > e_{n,lim} \\ 0 & \text{if } z(t) \leq e_{n,lim} \end{cases}$$

wherein $e_{n,lim}$ represents the voltage corresponding to the energy of random noise and determined experimentally, e.g. as the square root of value N generated by automatic test equipment 40 in FIG. 3 with no transition of signal $s_1$, and by processing for a given period of time the output signal of amplifier 1 due to background noise. FIG. 3A shows automatic test equipment 40' similar to the automatic test equipment 40 of FIG. 3 with the squaring block 34 replaced by a background noise filter 34'. Similar filtration is also possible in the analog solution.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of measuring switching noise of an audio amplifier, comprising the steps of:

switching said audio amplifier between at least two different operational states which generates a noise signal at an output of the audio amplifier;

filtering said noise signal to obtain an audio band signal; and determining a value of energy contained in said audio band signal.

2. The method of claim 1, wherein said step of switching said audio amplifier is performed when there is no signal present for amplification at an input of said audio amplifier.

3. The method of claim 1, wherein said filtering step includes a step of filtering said noise signal with an audio band filter.

4. The method of claim 1, wherein said filtering step includes a step of filtering said noise signal with an "A" filter.

5. The method of claim 1, wherein said determining step includes the steps of determining a value of power of said audio band signal, and integrating said value of power over a predetermined time interval.

6. The method of claim 5, wherein said step of determining the value of power of said audio band signal includes the step of squaring said audio band signal.

7. The method of claim 5, wherein said step of determining the value of power of said audio band signal includes the step of determining an absolute value of said audio band signal.

8. The method of claim 5, wherein said step of determining the value of power includes the step of eliminating a contribution of background noise.

9. A device for measuring switching noise of an audio amplifier having a signal input, a control input and an output; the device comprising:

switching control means for switching said audio amplifier between different at least two operational states which generates a noise signal at said output of said audio amplifier;

filter means for filtering said noise signal to obtain an audio band signal; and energy determining means for determining a value of energy of said audio band signal.

10. The device of claim 9, wherein said switching control means includes generating means coupled to said control input of said audio amplifier, said generating means generating a control signal for switching said audio amplifier between said at least two different operating states when there is no signal present at said signal input of said audio amplifier.

11. The device of claim 10, wherein said filter means includes a flat audio band filter.

12. The device of claim 10, wherein said audio filter has a lower cut-off frequency of approximately 20 Hz and an upper cut-off frequency of approximately 20 KHz.

13. The device of claim 10, wherein said filter means includes an "A" filter.

14. The device of claim 9, wherein said energy determining means includes:

power determining means for generating a power signal related to a value of power of said audio band signal; and integrating means for integrating said power signal over a predetermined time interval.

15. The device of claim 14, wherein said power determining means includes squaring means for calculating a square of said audio band signal.

16. The device of claim 14, wherein said power determining means includes computing means for calculating an absolute value of said audio band signal.

17. The device of claim 14, further comprising background noise filtering means, coupled to the computing means, for eliminating background noise in said audio band signal.

18. The device of claim 9, wherein said filter means and said energy determining means constitute digital signal processing means.

19. The device of claim 18, further comprising sampling means, interposed between said audio amplifier and said digital signal processing means, for sampling the noise signal and providing at an output a vector signal.

20. The device of claim 19, wherein said digital signal processing means further includes:

frequency-domain transformation means, interposed between said sampling means and said filter means, for providing a signal corresponding to a Fourier transform of the vector signal; and time-domain antitransformation means, interposed between said filter means and said energy determining means, for providing a signal corresponding to an inverse Fourier transform of the audio band signal.

21. The device of claim 18, further comprising a hearing sensitivity simulating filter connected to an output of said energy determining means.

22. The device of claim 21, wherein said hearing sensitivity simulating filter is a logarithmic filter.

23. The device of claim 9, wherein the device forms part of an automatic test unit.

24. A device for measuring switching noise of an audio amplifier having a signal input, a control input, and an output, the device comprising:

an audio filter having an input coupled to the output of the amplifier to receive a noise signal and an output that provides an audio band signal the audio band signal being generated by audio band filtering the noise signal; and an integrator having an input coupled to the output of the filter to receive the audio band signal and an output that provides a signal corresponding to a value of energy contained within the audio band signal.

25. The device of claim 24, further comprising a multiplier having an input coupled to the output of the filter and an output, coupled to the input of the integrator, that provides an absolute value of the audio band signal.

26. The device of claim 25, further comprising a switch disposed between the output of the multiplier and the input of the integrator, the switch selectively coupling the input of the integrator to the output of the multiplier.

27. The device of claim 26, further comprising switch control means that controls the switch to couple the input of the integrator to the output of the multiplier when the amplifier is switched between operational states.

28. The device of claim 24, wherein the filter is a band pass filter having a passband of 20 Hz to 20 KHz.

29. The device of claim 24, wherein the filter is an "A" filter.

30. The device of claim 27, further comprising a generator, coupled to the control input of the amplifier, that provides a control signal for changing an operational state of the amplifier.

31. The device of claim 30, further comprising a capacitor having a first terminal coupled to the input of the amplifier and having a second terminal coupled to a voltage reference.

32. An automatic test unit for measuring switching noise of an audio amplifier, the amplifier having a first input, a control input, and an output, the unit comprising:

a filter having an input coupled to the output of the amplifier that receives a noise signal from the amplifier and an output that provides a filtered signal, the filtered signal being generated by audio band filtering the noise signal;

an integrator circuit having an input coupled to the output of the filter to receive the filtered signal and an output that provides an energy signal corresponding to a value of energy contained within the filtered signal.

33. The automatic test unit of claim 32, further comprising a sampling circuit having an input coupled to the output of the amplifier to receive a noise signal and an output coupled to the filter to provide a vector signal, the sampling circuit sampling the noise signal to produce the vector signal.

34. The automatic test unit of claim 33, further comprising:

a frequency domain transformation circuit having an input, coupled to the output of the sampling circuit, that receives the vector signal, and having an output that provides a signal corresponding to a Fourier transform of the vector signal; and a time domain transformation circuit having an input, coupled to the output of the filter, that receives the filtered signal, and having an output coupled to the unit of the integrator that provides a real time domain vector signal corresponding to an inverse Fourier transform of the filtered signal.

35. The automatic test unit of claim 34, further comprising a squaring circuit having an input, coupled to the output of the time domain transformation circuit, that receives the real time domain vector signal, and having an output coupled to the integrator that provides a vector signal corresponding to a square of the real time domain vector signal.

36. The automatic test unit of claim 35, further comprising an output filter having an input coupled to the output of the integrating circuit, and having an output that provides a sensitivity signal, the output filter filtering the energy signal to simulate an energy sensitivity of a human ear.

* * * * *